(12) United States Patent
Horiuchi

(10) Patent No.: US 9,392,684 B2
(45) Date of Patent: Jul. 12, 2016

(54) WIRING SUBSTRATE AND METHOD FOR MANUFACTURING WIRING SUBSTRATE

(71) Applicant: SHINKO ELECTRIC INDUSTRIES CO., LTD., Nagano-ken (JP)

(72) Inventor: Akio Horiuchi, Nagano (JP)

(73) Assignee: Shinko Electric Industries Co., Ltd., Nagano-shi, Nagano-ken ( * ) Notice: Subject to any disclaimer, the term of this patent is extended or adjusted under 35 U.S.C. 154(b) by 596 days.

(21) Appl. No.: 13/833,047

(22) Filed: Mar. 15, 2013

(65) Prior Publication Data

US 2013/0264100 A1    Oct. 10, 2013

(30) Foreign Application Priority Data

Apr. 10, 2012    (JP) ................................ 2012-089245

(51) Int. Cl.
| | | |
|---|---|---|
| *H05K 1/02* | (2006.01) | |
| *H05K 3/46* | (2006.01) | |
| *H01L 23/498* | (2006.01) | |
| *H01L 21/48* | (2006.01) | |
| *H05K 3/00* | (2006.01) | |
| *H01L 23/14* | (2006.01) | |
| *H01L 23/15* | (2006.01) | |

(52) U.S. Cl.
CPC ............ *H05K 1/0271* (2013.01); *H01L 21/486* (2013.01); *H01L 23/49827* (2013.01); *H05K 1/0298* (2013.01); *H05K 3/4644* (2013.01); *H01L 23/145* (2013.01); *H01L 23/15* (2013.01); *H01L 23/49894* (2013.01); *H01L 2224/16* (2013.01); *H01L 2224/73204* (2013.01); *H05K 3/0055* (2013.01); *H05K 3/4673* (2013.01); *H05K 2201/09781* (2013.01); *H05K 2201/09881* (2013.01); *Y10T 29/49128* (2015.01)

(58) Field of Classification Search
CPC .. H05K 3/4602; H05K 1/0271; H05K 1/0298
See application file for complete search history.

(56) References Cited

U.S. PATENT DOCUMENTS

| 6,391,762 B1 * | 5/2002 | Gamota ................ H01L 21/563 257/E21.503 |
| 2005/0057146 A1 * | 3/2005 | Lee ...................... H01L 27/3288 313/504 |
| 2005/0284655 A1 * | 12/2005 | Hsu ....................... H05K 3/4602 174/255 |

FOREIGN PATENT DOCUMENTS

| JP | 9-321434 | 12/1997 |
| JP | 2004-221452 | 8/2004 |
| JP | 2010-010329 | 1/2010 |
| WO | WO 2011/011880 | 2/2011 |

OTHER PUBLICATIONS

Notification of Reasons for Rejection w/ English Translation; JP 2012-089245; Nov. 4, 2015; 6 pages.

* cited by examiner

*Primary Examiner* — Jeremy C Norris
(74) *Attorney, Agent, or Firm* — Fish & Richardson P.C.

(57) ABSTRACT

A method for manufacturing a wiring substrate includes alternately stacking first wiring patterns and first insulative layers on a first surface of a core substrate and alternately stacking second wiring patterns and second insulative layers on a second surface of the core substrate at an opposite side of the first surface. The number of the second insulative layers excluding the outermost second insulative layer differs from the number of the first insulative layers. The method further includes forming a via hole in the outermost first insulative layer to expose a portion of the outermost first wiring pattern, and exposing the outermost second wiring pattern by reducing the outermost second insulative layer in thickness. The method further includes forming a via in the via hole and forming a wiring pattern, which is connected by the via to the outermost first wiring pattern, on the outermost first insulative layer.

17 Claims, 5 Drawing Sheets

US 9,392,684 B2

WIRING SUBSTRATE AND METHOD FOR MANUFACTURING WIRING SUBSTRATE

CROSS-REFERENCE TO RELATED APPLICATIONS

This application is based upon and claims the benefit of priority from prior Japanese Patent Application No. 2012-089245, filed on Apr. 10, 2012, the entire contents of which are incorporated herein by reference.

FIELD

This disclosure relates to a wiring substrate and a method for manufacturing a wiring substrate.

BACKGROUND

Japanese Laid-Open Patent Publication No. 9-321434 describes an example of a multilayer wiring substrate used to mount electronic components. A multilayer wiring substrate includes insulative layers and wiring layers arranged on opposite sides of a core substrate. In such a wiring substrate, for example, the same number of insulative layers and wiring layers are arranged on each surface of the core substrate. A protective film is formed on an upper surface of the wiring substrate. Portions of a wiring pattern exposed through openings in the protective film are used as electrodes that are connected to electronic components such as semiconductor devices (LSI). A further protective film is formed on a lower surface of the wiring substrate. Portions of a wiring pattern exposed through openings in a protective film, which is formed on a lower surface of the wiring substrate, are used as electrodes that connect the wiring substrate to a mounting substrate.

In such a wiring substrate that, for example, arranges a semiconductor chip above the core substrate and connects a mounting substrate below the core substrate, an upper wiring pattern and a lower wiring pattern have different wire densities. The density difference is one factor that causes warping of the wiring substrate. A warped wiring substrate hinders the connection between the electrodes of the wiring substrate and the electrodes of the semiconductor device.

This may result in the occurrence of a connection failure between the wiring substrate and the semiconductor device.

SUMMARY

One aspect of the present invention is a method for manufacturing a wiring substrate. The method includes alternately stacking a plurality of first wiring patterns and a plurality of first insulative layers on a first surface of a core substrate and alternately stacking a plurality of second wiring patterns and a plurality of second insulative layers on a second surface of the core substrate located at an opposite side of the first surface. The number of the second insulative layers excluding an outermost one of the second insulative layers differs from the number of the first insulative layers. The method further includes forming a via hole in an outermost one of the first insulative layers to expose a portion of an outermost one of the first wiring patterns. The method further includes exposing an outermost one of the second wiring patterns by reducing the outermost second insulative layer in thickness. The method further includes forming a first seed layer, which covers the outermost first insulative layer, the exposed outermost first wiring pattern, and a wall of the via hole, and a second seed layer, which covers the outermost second insulative layer and the exposed outermost second wiring pattern. The method further includes forming a first resist layer, which covers the first seed layer and includes an opening at a location corresponding to the via hole, and a second resist layer, which covers the second seed layer. The method further includes using the first seed layer to form a via in the via hole and to form a wiring pattern, which is connected by the via to the outermost first wiring pattern, on the outermost first insulative layer. The method further includes removing the first resist layer and the second resist layer, and removing the first seed layer, which is exposed on the outermost first insulative layer, and the second seed layer.

Other aspects and advantages of the present invention will become apparent from the following description, taken in conjunction with the accompanying drawings, illustrating by way of example the principles of the invention.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. In the drawings, like numerals are used for like elements throughout.

DESCRIPTION OF THE EMBODIMENTS

One embodiment will now be described with reference to the drawings. The drawings schematically illustrate structural features and thus do not depict actual size and scale.

Figure 1:
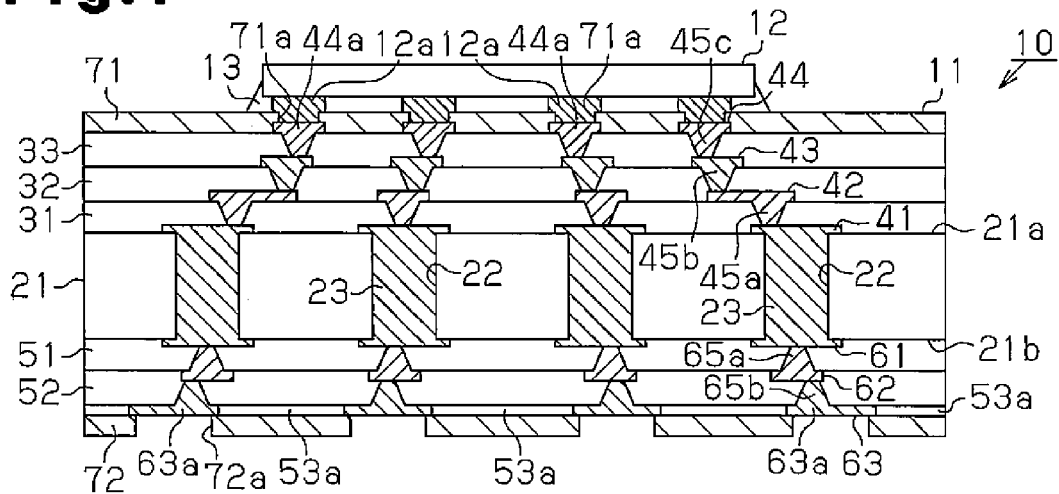
FIG. 1 is a schematic cross-sectional view of a semiconductor device.

As illustrated in FIG. 1, a semiconductor device 10 (semiconductor package) includes a wiring substrate 11 and a semiconductor chip 12, which is mounted on a surface (upper surface in FIG. 1) of the wiring substrate 11. The wiring substrate 11 includes a core substrate 21. The core substrate 21 is, for example, a so-called glass epoxy substrate formed by hardening a thermosetting insulative resin impregnated in a glass cloth that serves as a reinforcement material. The main component of the insulative resin is epoxy resin.

The core substrate 21 includes a first surface (upper surface 21a in FIG. 1) and a second surface (lower surface 21b in FIG. 1), which is located at the opposite side of the first surface. Through holes 22 extend through the core substrate 21 between the upper surface 21a and the lower surface 21b at predetermined locations. Each through hole 22 includes a through electrode 23 that extends between the upper surface 21a and the lower surface 21b of the core substrate 21. The material of the through electrode 23 is, for example, copper (Cu).

A wiring pattern 41, an insulative layer 31, a wiring pattern 42, an insulative layer 32, a wiring pattern 43, an insulative layer 33, and a wiring pattern 44 are sequentially stacked on the upper surface 21a of the core substrate 21. A wiring pattern 61, an insulative layer 51, a wiring pattern 62, an insulative layer 52, and a wiring pattern 63 are sequentially stacked on the lower surface 21b of the core substrate 21. Accordingly, in the wiring substrate 11 of the present embodiment, the number of insulative layers and wiring patterns above the core substrate 21 differs from the number of insulative layers and wiring patterns below the core substrate 21. The material of the insulative layers 31 to 33 and the insulative layers 51 and 52 is, for example, an epoxy insulative resin. The material of the wiring patterns 41 to 44 and the wiring patterns 61 to 63 is, for example, copper.

The wiring pattern 42 is electrically connected by vias 45a, which extend between the upper and lower surfaces of the insulative layer 31, to the wiring pattern 41. In the same manner, the wiring pattern 43 is electrically connected by vias 45b to the wiring pattern 42, and the wiring pattern 44 is electrically connected by vias 45c to the wiring pattern 43. The surface of the insulative layer 33, which is the outermost layer, and the surface of the wiring pattern 44 are covered by a protective film 71 of solder resist or the like. Openings 71a are formed at predetermined locations in the protective film 71. The wiring pattern 44 exposed through the openings 71a function as electrodes 44a connected to the semiconductor chip 12. The semiconductor chip 12 includes bumps 12a that are flip-chip bonded to the electrodes 44a.

An underfill resin 13 fills the space between the semiconductor chip 12 and the protective film 71 of the wiring substrate 11. The underfill resin 13 improves the connection strength of the electrodes 44a and the bumps 12a. Further, the underfill resin 13 reduces corrosion or the like of the wiring pattern 44 and prevents the connection reliability of the wiring substrate 11 and the semiconductor chip 12 from decreasing. The material of the underfill resin 13 is, for example, epoxy resin.

At the lower side of the core substrate 21, the wiring pattern 62 is electrically connected by vias 65a, which extend between the upper and lower surfaces of the insulative layer 51, to the wiring pattern 61. In the same manner, the wiring pattern 63 is electrically connected by vias 65b to the wiring pattern 62. An insulative film 53a is formed on the surface (lower surface) of the insulative layer 52. The insulative film 53a covers the space between portions of the wiring pattern 63 and the space between the wiring pattern 63 and the ends of the insulative layer 52. The insulative film 53a has the same thickness as the wiring pattern 63. The surface (lower surface) of the insulative film 53a is flush with the surface (lower surface) of the wiring pattern 63. The material of the insulative film 53a is, for example, epoxy insulative resin. The lower surface of the insulative film 53a and the lower surface of the wiring pattern 63 are covered by a protective film 72 of solder resist or the like. Openings 72a are formed at predetermined locations in the protective film 72. The wiring pattern 63 exposed through the openings 72a function as external connection pads 63a. The semiconductor device 10 is mounted on a mounting substrate (not illustrated), and the external connection pads 63a are connected by bumps (solder balls or the like) to the mounting substrate.

In the wiring substrate 11, the number of the insulative layers 31 to 33 above the core substrate 21 is greater than the number of the insulative layers 51 and 52 below the core substrate 21. Due to the difference in the number of the upper insulative layers 31 to 33 and the number of the lower insulative layers 51 and 52, the curing contraction that occurs during a manufacturing process changes the volume of the insulative layers 31 to 33 and the insulative layers 51 and 52. The volume change may be used to adjust warping of the wiring substrate 11. Further, in the wiring substrate 11, the number of the wiring patterns 41 to 44 above the core substrate 21 is greater than the number of the wiring patterns 61 to 63 below the core substrate 21. For example, the wiring patterns 41 to 44 are finely patterned in accordance with the number and pitch of the bumps 12a on the semiconductor chip 12. The wiring patterns 61 to 63 transmit signals to the mounting substrate. The wiring patterns 61 to 63 are formed to allow for the arrangement of a ground plane having a ground level potential and a power plane having a predetermined potential with respect to the ground potential. The ground plane and the power plane are patterned (solid-patterned) to spread entirely along the lower surface 21b of the core substrate 21. Thus, the upper wiring patterns 41 to 44 and the lower wiring patterns 61 to 63 have different wire densities. Accordingly, the difference in the number of layers of the upper wiring patterns 41 to 44 and the number of layers of the lower wiring patterns 61 to 63 allows for the adjustment of the warping of the wiring substrate 11. In the wiring substrate 11, the number of the wiring patterns 41 to 44 and the insulative layers 31 to 33 above the core substrate 21 and the number of the wiring patterns 61 to 63 and the insulative layers 51 and 52 below the core substrate 21 are determined to shape the warping of the wiring substrate 11 in accordance with the semiconductor chip 12. Accordingly, the conformance of the warping of the wiring substrate 11 with the semiconductor chip 12 improves the connection reliability of the electrodes 44a of the wiring substrate 11 and the bumps 12a of the semiconductor chip 12. The number of the wiring patterns and the insulative layers are determined based on the results obtained when measuring or simulating the warping of the wiring substrate 11 after changing the number of such layers.

A method for manufacturing the wiring substrate 11 will now be described.

Figure 2A:
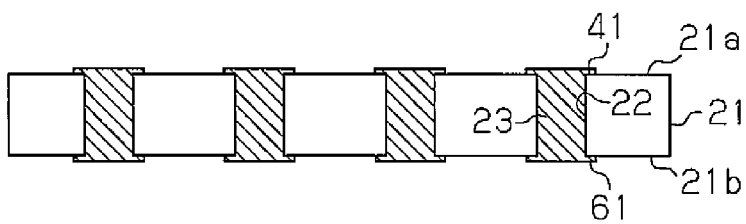
FIGS. 2A to 2D, 3A to 3E, and 4A to 4E are schematic cross-sectional views illustrating manufacturing steps of a wiring substrate.

In the method for manufacturing the wiring substrate 11 of FIG. 1, the core substrate 21 illustrated in FIG. 2A is used. The core substrate 21 is, for example, a glass epoxy substrate. The through holes 22 are formed in the core substrate 21, and the through electrodes 23 are formed in the through holes 22. An electrolytic plating process, for example, is performed to form the through electrodes 23. Then, the wiring pattern 41, which is connected to one end of each through electrode 23, is formed on the upper surface 21a of the core substrate 21. Further, the wiring pattern 61, which is connected to the other end of each through electrode 23, is formed on the lower surface 21b of the core substrate 21. A semi-additive process or a subtractive process, for example, is performed to form the wiring patterns 41 and 61.

Figure 2B:
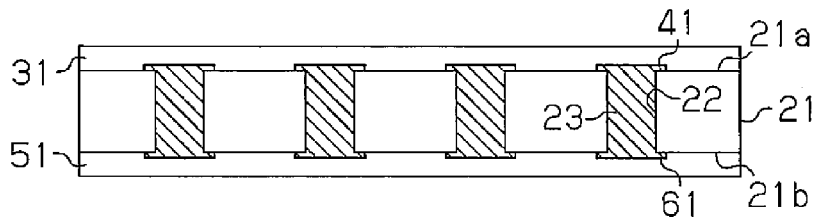

Referring to FIG. 2B, the insulative layer 31 is formed on the upper surface 21a of the core substrate 21, and the insulative layer 51 is formed on the lower surface 21b of the core substrate 21. For example, the two surfaces 21a and 21b of the core substrate 21 are laminated with a resin film. Then, the resin film undergoes a heat treatment while being pressed and is thus cured to form the insulative layers 31 and 51. The insulative layers 31 and 51 have a thickness of, for example, 20 to 30 micrometers (μm).

Figure 2C:
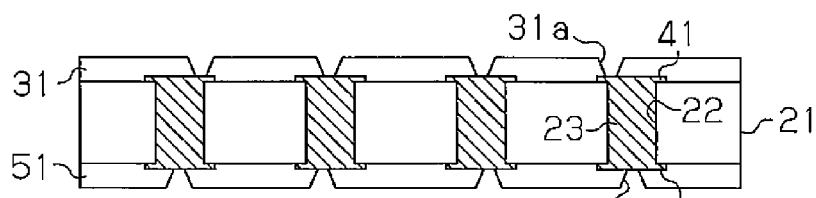

Referring to FIG. 2C, via holes 31a are formed at predetermined locations in the insulative layer 31 to expose portions of the upper surface of the wiring pattern 41. In the same manner, via holes 51a are formed at predetermined locations in the insulative layer 51 to expose portions of the lower surface of the wiring pattern 61. A laser process, for example, is performed to form the via holes 31a and 51a. After the formation of the via holes 31a and 51a, a desmear process is performed to remove residual resin (resin smear) of the insulative layers 31 and 51 from the surfaces of the wiring patterns 41 and 61 exposed at bottom portions of the via holes 31a and 51a. In the desmear process, for example, a permanganic acid solution is used to dissolve and remove the residual resin, that is, to etch the residue.

Figure 2D:
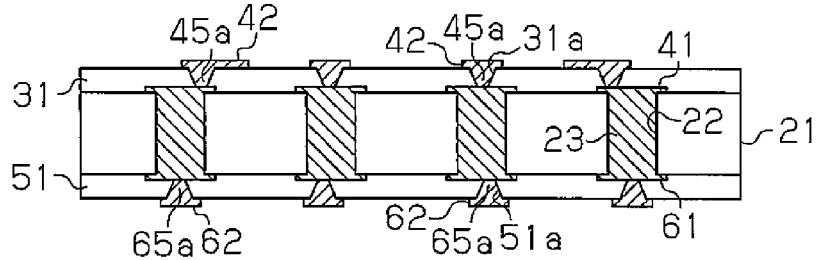

Referring to FIG. 2D, the via 45a is formed in each via hole 31a, and the wiring pattern 42 is formed on the upper surface of the insulative layer 31. In the same manner, the via 65a is formed in each via hole 51a, and the wiring pattern 62 is formed on the lower surface of the insulative layer 51. A semi-additive process, for example, is performed to form the wiring pattern 42 and the vias 45a. The wiring patterns 42 and 62 have a thickness of, for example, 10 to 15 μm.

Figure 3A:
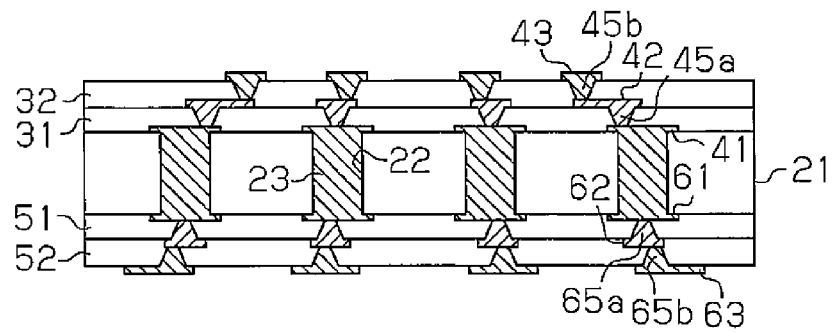

Referring to FIG. 3A, steps similar to those illustrated in FIGS. 2B to 2D are repeated to form the insulative layer 32 above the wiring pattern 42 and form the wiring pattern 43, which is connected by the vias 45b to the wiring pattern 42. In the same manner, the insulative layer 52 is formed below the wiring pattern 62, and then the wiring pattern 63, which is connected by the vias 65b to the wiring pattern 62, is formed.

Figure 3B:
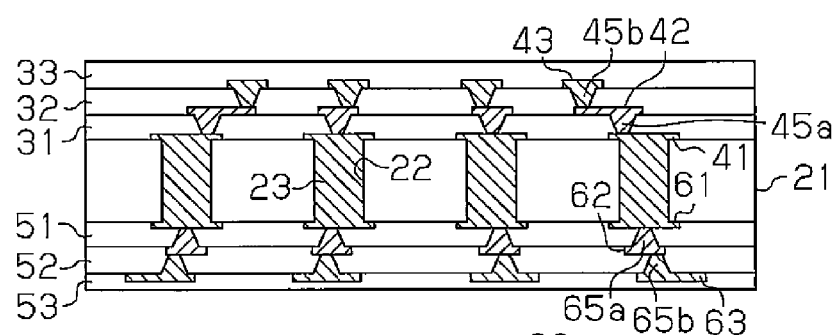

Referring to FIG. 3B, the insulative layer 33 is formed to cover the upper surfaces of the wiring pattern 43 and the insulative layer 32. Further, an insulative layer 53 is formed to cover the lower surfaces of the wiring pattern 63 and the insulative layer 52. The insulative layer 53 is thinner than the insulative layer 33. The insulative layer 53 on the wiring pattern 63 has a thickness of, for example, 5 to 6 μm.

Figure 3C:
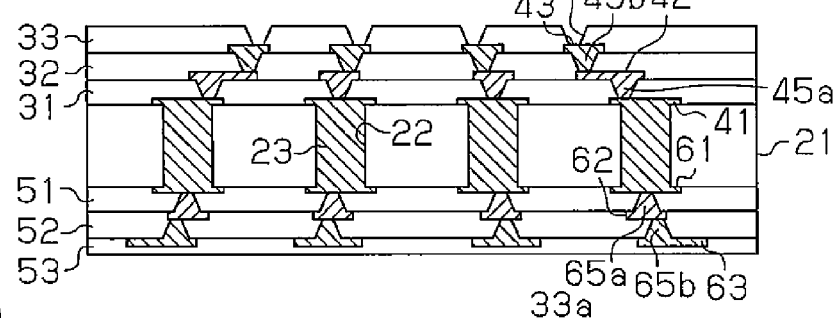
Figure 3D:
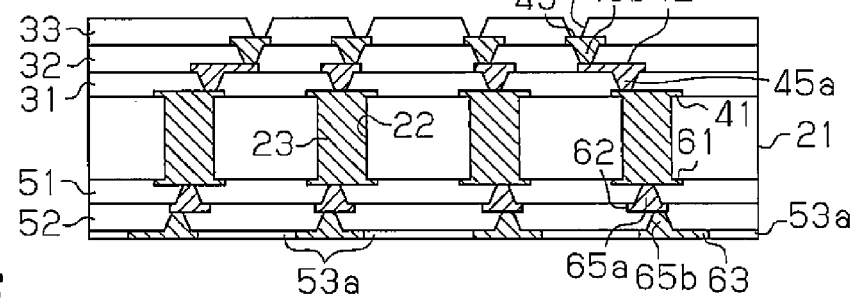

Referring to FIG. 3C, via holes 33a are formed at predetermined locations in the insulative layer 33 to expose portions of the upper surface of the wiring pattern 43. Then, a desmear process is performed to remove residual resin of the insulative layer 33 from the upper surface of the wiring pattern 43 exposed at bottom portions of the via holes 33a. The desmear process also removes a lower portion of the insulative layer 53. The desmear process removes the surfaces of the insulative layers 33 and 53 by a thickness of 5 to 6 μm. In other words, the thickness of the insulative layer 53 formed in the process illustrated in FIG. 3B is set so that the portion of the insulative layer 53 located downward (outward) from the surface of the wiring pattern 63 is removed by the desmear process. The desmear process exposes the surface of the wiring pattern 63 as illustrated in FIG. 3D and forms the insulative film 53a, which covers the lower surface of the insulative layer 52 excluding portions where the wiring pattern 63 is formed.

Figure 3E:
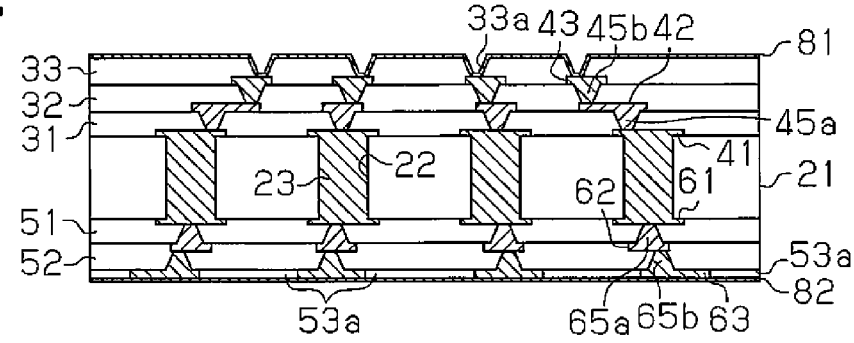

Referring to FIG. 3E, a seed layer 81 is formed to cover the wall surface of each via hole 33a, the upper surface of the insulative layer 33, and the upper surface of the wiring pattern 43. For example, electroless plating (e.g., electroless copper plating) is performed to form the seed layer 81. In the same manner, a seed layer 82 is formed to cover the lower surfaces of the wiring pattern 63 and the insulative film 53a. The seed layer 82 entirely coves the lower surfaces of the wiring pattern 63 and the insulative film 53a, which are flush with each other.

Figure 4A:
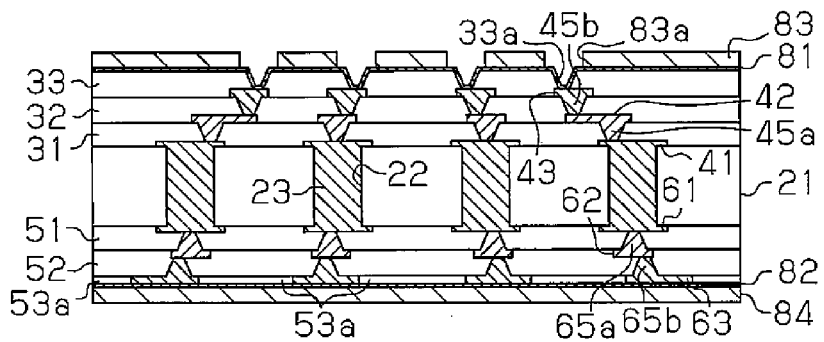

Referring to FIG. 4A, a resist layer 83, which includes openings 83a at locations corresponding to the wiring pattern 44 and the vias 45c (refer to FIG. 1), is formed on the seed layer 81. The resist layer 83 is formed, for example, by applying a dry film resist (DFR) to the seed layer 81. A photolithography process, for example, is performed to pattern the resist layer 83. In the same manner, a resist layer 84 is formed on the entire lower surface of the seed layer 82.

Figure 4B:
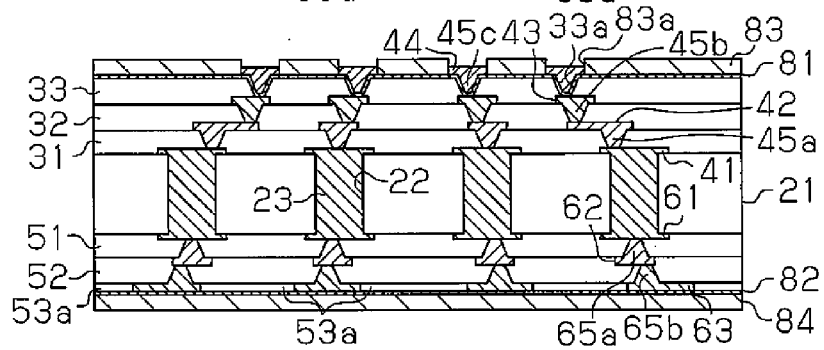

Referring to FIG. 4B, electrolytic plating (e.g., electrolytic copper plating) is performed using the upper seed layer 81 as a power supply layer to form the vias 45c in the via holes 33a and form the wiring pattern 44 on the insulative layer 33. Here, the surface of the seed layer 82, which is located below the core substrate 21, is covered by the resist layer 84. Thus, electrolytic plating is not applied to the seed layer 82.

Figure 4C:
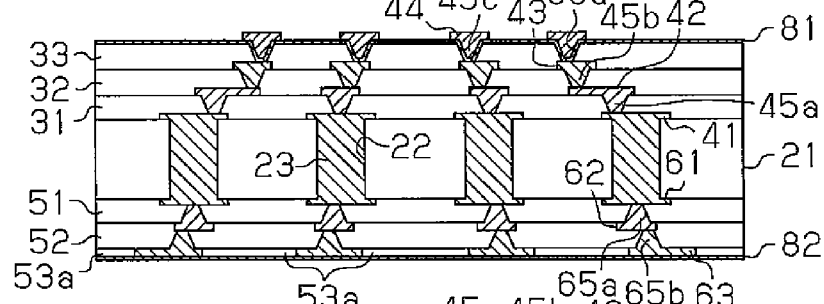

Referring to FIG. 4C, the resist layers 83 and 84 are removed.

Figure 4D:
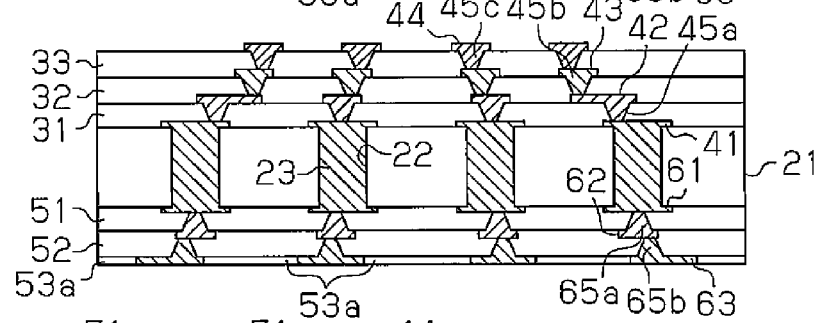

Referring to FIG. 4D, the seed layers 81 and 82 are etched and removed.

Figure 4E:
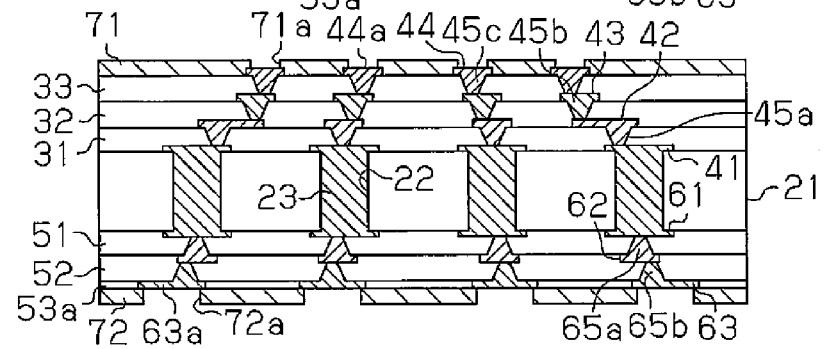

Referring to FIG. 4E, the protective film 71 is formed on the upper surfaces of the insulative layer 33 and the wiring pattern 44. The protective film 71 includes openings 71a that expose portions of the wiring pattern 44 functioning as the electrodes 44a. In the same manner, the protective film 72 is formed on the lower surfaces of the insulative film 53a and the wiring pattern 63. The protective film 72 includes openings 72a that expose portions of the wiring pattern 63 functioning as the external connection pads 63a. The protective films 71 and 72 are formed by, for example, laminating a solder resist film of a photosensitive resin, such as epoxy resin, and patterning the resist film into a given shape. The manufacturing steps described above manufacture the wiring substrate 11 illustrated in FIG. 1.

The present embodiment has the advantages described below.

(1) In the wiring substrate 11, the three insulative layers 31 to 33 are formed above the core substrate 21 (on the first surface 21a), and the two insulative layers 51 and 52 are formed below the core substrate 21 (on the second surface 21b). The wiring pattern 63 and the insulative film 53a, which covers the surface of the insulative layer 52 and exposes the surface of the wiring pattern 63, are formed on the surface of the insulative layer 52. The wire density is lower above the core substrate 21 than below the core substrate 21. The curing contraction that occurs during a manufacturing process changes the volume of the three insulative layers 31 to 33 formed above the core substrate 21 and the volume of the two insulative layers 51 and 52 formed below the core substrate 21. In this manner, the difference in the number of insulative layers above the core substrate 21 and the number of insulative layers below the core substrate 21 adjusts the warping of the wiring substrate 11. Accordingly, the warping of the wiring substrate 11 may be adjusted in accordance with the semiconductor chip 12 connected to the wiring substrate 11, and the connection reliability of the terminals of the semiconductor chip 12 and the electrodes 44a of the wiring substrate 11 may be improved.

(2) The manufacturing process of the wiring substrate 11 includes the desmear process that removes the residual resin in the via holes 33a, which are formed in the insulative layer 33. The desmear process removes most of the insulative layer 53 until exposing the surface (lower surface) of the wiring pattern 63 thereby forming the insulative film 53a. More specifically, when forming the insulative layer 33, the insulative layer 53, which corresponds to the insulative layer 33, is formed. Then, portions of the insulative layer 53 are used to form the insulative film 53a. In other words, even though the insulative layers 51 to 53 below the core substrate 21 are formed in the same steps as the insulative layers 31 to 33 above the core substrate 21, the wiring substrate 11 is formed so that the number of insulative layers differs between the upper side and lower side of the core substrate 21. As a result, the wiring substrate 11 may easily be formed without adding many steps.

(3) Referring to FIG. 3E, the manufacturing process of the wiring substrate 11 forms the seed layer 81 (first seed layer) and the seed layer 82 (second seed layer). The seed layer 81 covers the wall surfaces of the via holes 33a, the upper surface of the wiring pattern 43 exposed from the via holes 33a, and the upper surface of the insulative layer 33. The seed layer 82 covers the lower surfaces of the wiring pattern 63 and the insulative film 53a. Then, referring to FIG. 4A, the resist layer 83, which covers the upper surface of the seed layer 81 and includes the openings 83a at locations corresponding to the via holes 33a, and the resist layer 84, which covers the lower surface of the seed layer 82, are formed. Next, referring to FIG. 4B, the vias 45c are formed in the via holes 33a, and the wiring pattern 44, which is connected by the vias 45c to the wiring pattern 43, is formed on the insulative layer 33. In this case, the vias 45c and the wiring pattern 44 are formed by performing electrolytic plating that uses the seed layer 81. Here, the lower surface of the seed layer 82 is entirely covered by the resist layer 84. Thus, electrolytic plating is not applied to the seed layer 82. These steps are performed so that the number of the layers of the upper wiring patterns 41 to 44 is greater than the number of the layers of the lower wiring patterns 61 to 63. In the conventional wiring substrate, the number of wiring layers (wiring patterns) and insulative layers stacked on the upper surface of a core substrate is the same as the number of wiring layers (wiring patterns) and insulative layers stacked on the lower surface of the core substrate. The wiring patterns and the vias formed below the core substrate are not finely laid out and are oftentimes formed to connect upper and lower wiring patterns. Accordingly, by covering the entire lower surface of the seed layer 82 with the resist layer 84, the number of wiring layers may be reduced with only a few changes in the manufacturing steps from the prior art. Further, the reduction in the number of wiring layers allows the wiring substrate 11 to be reduced in thickness as compared with the prior art.

It should be apparent to those skilled in the art that the present invention may be embodied in many other specific forms without departing from the spirit or scope of the invention. Particularly, it should be understood that the present invention may be embodied in the following forms.

Figure 5A:
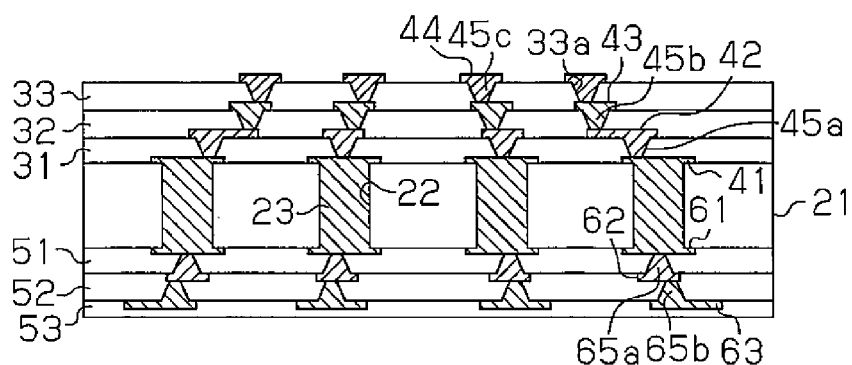
FIGS. 5A to 5C are schematic cross-sectional views illustrating manufacturing steps of another wiring substrate.
Figure 5B:
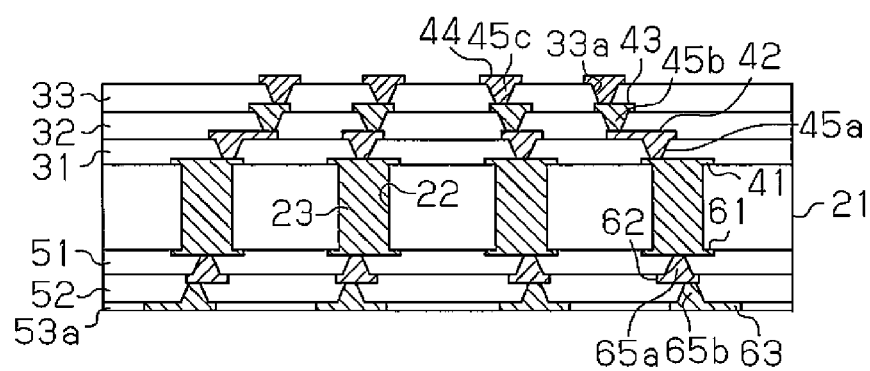
Figure 5C:
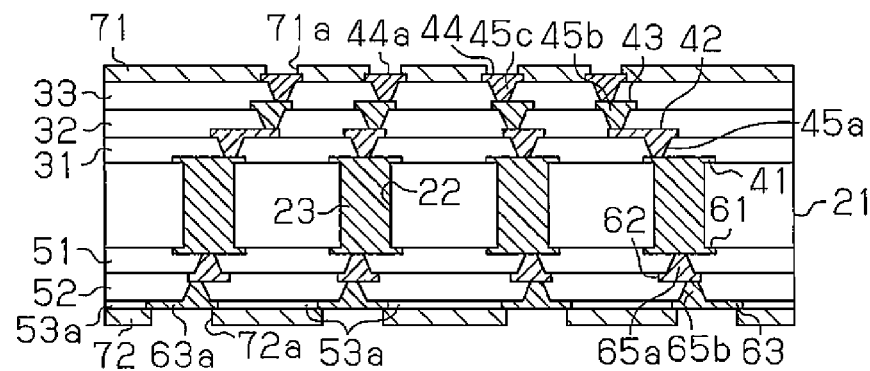

In the above embodiment, referring to FIGS. 3C, 3D, and 4B, the insulative film 53a, which exposes the wiring pattern 63, is formed by removing a predetermined thickness from the insulative layer 53, which covers the wiring pattern 63. Then, the wiring pattern 44 and the vias 45c are formed. Instead, the wiring pattern 44 and the vias 45c may first be formed, and the insulative film 53a may then be formed by removing a portion of the insulative layer 53. In this case, for example, after the step illustrated in FIG. 3C, referring to FIG. 5A, the vias 45c are formed in the via holes 33a of the insulative layer 33, and thereafter the wiring pattern 44 is formed on the upper surface of the insulative layer 53. Then, referring to FIG. 5B, the insulative layer 53 covering the lower surface of the wiring pattern 63 is reduced in thickness to form the insulative film 53a. Here, the lower surface of the insulative layer 53 may be, for example, polished or etched to form the insulative film 53a. The etching process may use, for example, a permanganic acid solution. Then, referring to FIG. 5C, the protective films 71 and 72 are formed thereby completing the wiring substrate 11. This method also allows for the manufacturing of the wiring substrate 11 that reduces connection failures.

Figure 6:
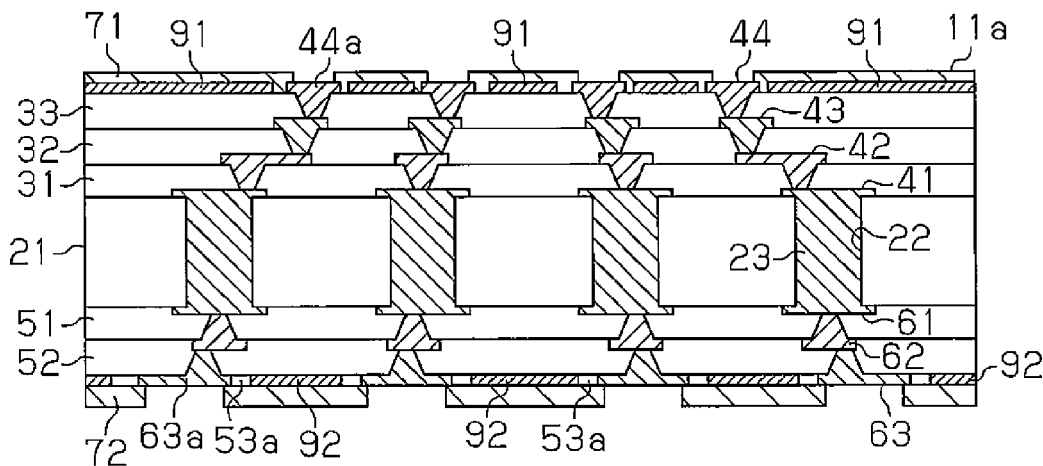
FIG. 6 is a schematic cross-sectional view illustrating a further wiring substrate.

In the above embodiment, a dummy pattern may be laid out in addition to the wiring patterns 41 to 44 and 61 to 63 in order to adjust the wire density. FIG. 6 illustrates a wiring substrate 11a including a dummy pattern 91 formed on the upper surface of the insulative layer 33 and a dummy pattern 92 formed on the lower surface of the insulative layer 52. The dummy patterns 91 and 92 may be formed, for example, in the same step as the wiring patterns 44 and 63 by performing a semi-additive process. In this structure, the dummy patterns 91 and 92 allow the wire density of the wiring substrate 11a to be adjusted so that the substrate warping has the desired shape. The dummy patterns 91 and 92 may be formed on either one of the upper and lower sides of the core substrate 21. Further, the formation of a dummy pattern is not limited to the outermost insulative layer. A dummy pattern may also be formed on an inner insulative layer. Moreover, a plurality of dummy patterns may be formed on either one of the upper and lower sides of the core substrate 21.

Figure 7:
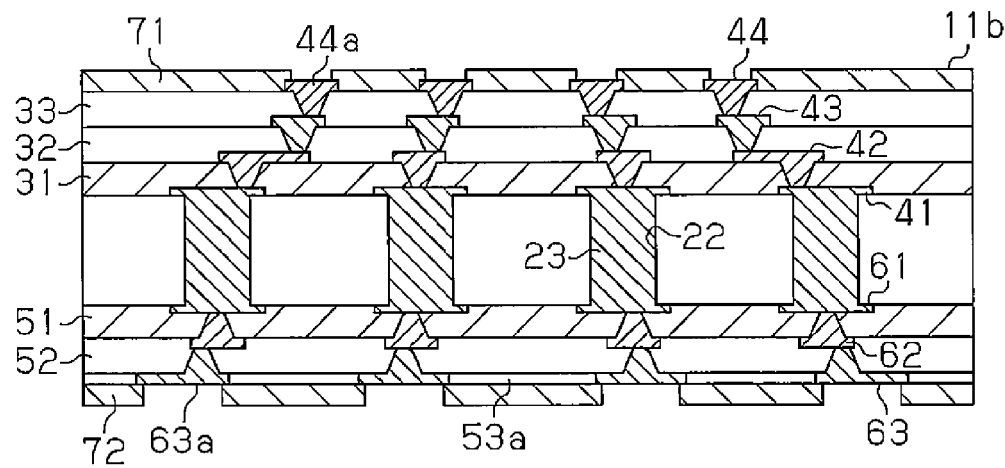
FIG. 7 is a schematic cross-sectional view illustrating a further wiring substrate.

In the above embodiment, at least one of the insulative layers 31 to 33, 51, and 52 may include reinforcement material. For example, FIG. 7 illustrates a wiring substrate 11b including insulative layers 31 and 51, which include reinforcement material. Thus, the insulative layers 31 and 51 have a higher mechanical strength (rigidity, hardness, and the like) than that of the other insulative layers 32, 33, and 52. An insulative resin prepared by including reinforcement material in a thermosetting resin may be used to form the insulative layers 31 and 51. For example, an insulative resin including reinforcement material that impregnates an epoxy or polyimide thermosetting resin in a woven cloth or non-woven cloth of glass, aramid, or liquid crystal polymer (LCP) fibers may be used as the material of the insulative layers 31 and 51. In this manner, the use of the insulative layers 31 and 51 that have increased mechanical strength allows for the warping of the wiring substrate 11b to be adjusted to the desirable shape.

The material of the insulative layers 31 to 33, 51, and 52 is not limited to epoxy resin and may be a different material such as polyimide resin.

The material of the wiring patterns 41 to 44 and 61 to 63 is not limited to copper and may be a different metal, such as gold, or an alloy.

The wiring patterns 41 to 44 and 61 to 63 may be formed through various types of wiring formation processes, such as the subtractive process.

The seed layers 81 and 82 do not have to be formed through an electroless plating process and may be formed through other processes, such as sputtering.

The protective films 71 and 72 may be formed by, for example, applying a liquid solder resist and then patterning the resist to a desired shape.

In the above embodiment, the structure and material of the core substrate 21 are not particularly limited.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a core substrate including an upper surface and a lower surface located at an opposite side of the upper surface;
a plurality of first wiring patterns and a plurality of first insulative layers alternately stacked on the upper surface of the core substrate;
a plurality of second wiring patterns and a plurality of second insulative layers alternately stacked on the lower surface of the core substrate, wherein the number of second insulative layers stacked on the lower surface is less than the number of first insulative layers stacked on the upper surface;
an insulative film that covers a surface of an outermost one of the second insulative layers stacked on the lower surface and exposes a surface of an outermost one of the second wiring patterns stacked on the lower surface, wherein the insulative film is entirely arranged in one or more spaces between i) portions of the outermost one of the second wiring patterns and ii) portions of the outermost one of the second wiring patterns and ends of the outermost one of the second insulative layers;

a first solder resist that covers a surface of an outermost one of the first insulative layers and a surface of an outermost one of the first wiring patterns; and a second solder resist that covers a surface of the insulative film and the surface of the outermost one of second wiring patterns.

2. The wiring substrate according to claim 1, wherein the surface of the insulative film is flush with the surface of the outermost one of the second wiring patterns stacked on the lower surface.

3. The wiring substrate according to claim 1, further comprising a dummy pattern formed at a side of at least one of the upper and lower surfaces.

4. The wiring substrate according to claim 1, wherein at least one of the first insulative layers formed on the upper surface and the second insulative layers formed on the lower surface includes reinforcement material.

5. The wiring substrate according to claim 1, wherein
the first solder resist includes an opening that exposes a portion of the outermost one of the first wiring patterns as an electrode, and
the second solder resist includes an opening that exposes a portion of the outermost one of the second wiring patterns as a pad.

6. The wiring substrate according to claim 1, wherein
the second wiring patterns are formed to allow for an arrangement of a ground plane having a ground potential and a power plane having a predetermined potential with respect to the ground potential, and
the ground plane and the power plane are solid-patterned to spread entirely along the lower surface of the core substrate.

7. The wiring substrate according to claim 1, wherein the insulative film is thinner than each of the first insulative layers and each of the second insulative layers.

8. The wiring substrate according to claim 1, wherein
the second solder resist is thicker than the insulative film, and
the second solder resist entirely covers the surface of the insulative film and partially covers the surface of the outermost one of second wiring patterns to expose a portion of the outermost one of the second wiring patterns as a pad.

9. The wiring substrate according to claim 1, further comprising a dummy pattern formed on the surface of the outermost one of the second insulative layers, wherein
a portion of the outermost one of the second wiring layers serves as a pad, and
the dummy pattern includes a surface that is flush with the surface of the insulative film and a surface of the pad.

10. A wiring substrate comprising:
a core substrate including an upper surface and a lower surface located at an opposite side of the upper surface;
a plurality of first wiring patterns and a plurality of first insulative layers alternately stacked on the upper surface of the core substrate;
a plurality of second wiring patterns and a plurality of second insulative layers alternately stacked on the lower surface of the core substrate, wherein the number of second insulative layers stacked on the lower surface is less than the number of first insulative layers stacked on the upper surface; and
an insulative film that covers a surface of an outermost one of the second insulative layers stacked on the lower surface and exposes a surface of an outermost one of the second wiring patterns stacked on the lower surface,
wherein a wiring density of the first wiring patterns above the core substrate is lower than a wiring density of the second wiring patterns below the core substrate.

11. The wiring substrate according to claim 10, wherein the insulative film includes a surface that is flush with the surface of the outermost one of the second wiring patterns stacked on the lower surface.

12. The wiring substrate according to claim 10, further comprising a dummy pattern formed at a side of at least one of the upper and lower surfaces.

13. The wiring substrate according to claim 10, wherein at least one of the first insulative layers formed on the upper surface and the second insulative layers formed on the lower surface includes reinforcement material.

14. The wiring substrate according to claim 10, wherein
the second wiring patterns are formed to allow for an arrangement of a ground plane having a ground potential and a power plane having a predetermined potential with respect to the ground potential, and
the ground plane and the power plane are solid-patterned to spread entirely along the lower surface of the core substrate.

15. The wiring substrate according to claim 10, wherein the insulative film is thinner than each of the first insulative layers and each of the second insulative layers.

16. The wiring substrate according to claim 10, further comprising a solder resist that is thicker than the insulative film, and
the solder resist entirely covers a surface of the insulative film and partially covers the surface of the outermost one of second wiring patterns to expose a portion of the outermost one of the second wiring patterns as a pad.

17. The wiring substrate according to claim 10, further comprising a dummy pattern formed on the surface of the outermost one of the second insulative layers, wherein
a portion of the outermost one of the second wiring layers serves as a pad, and
the dummy pattern includes a surface that is flush with a surface of the insulative film and a surface of the pad.

* * * * *